United States Patent [19]

Mastrangelo

[11] 3,864,715

[45] Feb. 4, 1975

[54] DIODE ARRAY-FORMING ELECTRICAL ELEMENT

[75] Inventor: Sebastian Vito Rocco Mastrangelo, Hockessin, Del.

[73] Assignee: E. I. du Pont de Nemours and Company, Wilmington, Del.

[22] Filed: Dec. 22, 1972

[21] Appl. No.: 317,382

[52] U.S. Cl. .................... 357/1, 340/173 SP, 357/9, 357/11, 357/15, 357/45, 357/72

[51] Int. Cl. .............................................. H01l 19/00

[58] Field of Search ......... 317/234 S, 234 T, 234 V; 340/173 SP

[56] References Cited

UNITED STATES PATENTS

| | | | |
|---|---|---|---|
| 2,877,371 | 3/1959 | Orthuber et al. | 313/108 B |
| 3,359,521 | 12/1967 | Lew et al. | 317/234 T |
| 3,508,961 | 4/1970 | Makino et al. | 317/234 T |
| 3,571,809 | 3/1971 | Nelson | 317/234 V |
| 3,625,688 | 12/1971 | Tevelde | 317/234 S |
| 3,629,155 | 12/1971 | Kristensen | 317/234 T |
| 3,634,692 | 1/1972 | Padovani et al. | 317/234 S |
| 3,634,927 | 1/1972 | Neale et al. | 317/234 V |
| 3,649,354 | 3/1972 | TeVelde | 317/234 S |
| 3,685,028 | 8/1972 | Wakabayashi | 317/234 V |
| 3,699,543 | 10/1972 | Neale | 317/234 V |
| 3,715,634 | 2/1973 | Ovshinsky | 317/234 V |

OTHER PUBLICATIONS

CHSie, Thesis, "Memory Cell Using Bistable Resistivity...," Iowa State U. Engineering, Research Instit., May 1969, pp 1-4.

*Primary Examiner*—Rudolph V. Rolinec
*Assistant Examiner*—William D. Larkins

[57] ABSTRACT

A normally insulative layered element, useful in diode array preparation and comprising an electrically activatable electrode composition of metal particles dispersed in a polymeric binder, which composition contacts a semiconductor material.

15 Claims, 4 Drawing Figures

DIODE ARRAY-FORMING ELECTRICAL ELEMENT

BACKGROUND OF THE INVENTION

1. Field of the Invention

This invention relates to a normally insulative layered element which is useful in electrically forming an array of closely spaced rectifying diode paths and which can function as a read-only memory for computer operation.

2. Description of the Prior Art

The most common type of computer memory now in operation is the magnetic core memory composed of tiny toroids made from magnetic material that have two distinct magnetic states. Two wires thread through each core passing by a toroid that will switch states only when both wires carry a current.

A second kind of memory called a read-only memory (ROM) does not store but instead transmits computer input or output in a predetermined pattern along selected wire paths, thereby screening information entering or being read-out of core memory.

At present there are basically four commercially available types of read-only memory systems for use in computers: fusible link, scribable link, custom mask, and woven cores. In the woven core version large magnetic cores are selectively and laboriously threaded with a large number of wires to produce the pattern required for screening information. Each wire usually corresponds to an address, and when pulsed, produces an output only only from those cores through which it threads. In the custom mask form a semiconductor array is made by custom tooling so that it contains only those elements necessary to store the required information pattern.

Fusible and scribable link read-only memories first require construction of a semiconductor diode matrix with all possible diodes in place; then many of the diodes are burned out by electrical means or removed mechanically by cutting or scribing. Both methods waste extensive amounts of expensive semiconductor material by forming separate diodes that are never used as diodes.

To avoid forming separate semiconductor diodes, a matrix of randomly distributed diodes called a multi-point rectifier can be made by putting a layer of metal particles, dispersed in a lacquer, in mechanical contact with a continuous semiconductive layer. U.S. Pat. No. 2,819,436 discloses such a multi-point rectifier as comprising a base electrode, a semiconductive layer such as selenium, a multi-point counter electrode consisting of small metal particles distributed in a non-conductive lacquer, and a layer of the non-conductive lacquer as an insulative barrier between the continuous selenium layer and the conductive metal particles. The small metal particles are said to make the counter electrode conductive. The base electrode is continuous and also conducts laterally like tthe counter electrode, so that it is not possible to use such a multi-point rectifier in a simple manner to create an array of diodes because, even if a random array is internally contained, its locations cannot be uniquely addressed without risk of unintentional false access to unwanted information.

SUMMARY OF THE INVENTION

A layered electrical element which is normally insulative but capable of becoming asymmetrically conductive upon electrical activation, which element comprises:

a. an activatable electrode composition consisting essentially of an insulating binder having insulated metal particles dispersed therein, the particles and binder together constituting an insulator in the unactivated state but being capable of becoming electrically conductive on exposure to an activating potential, and b. a semiconductor component in contact with (a), said layered element presenting a first surface, a second opposing surface and a volume therebetween which are normally non-conductive, said surfaces being capable of remaining laterally non-conductive and said volume being capable of becoming conductive between said surfaces on exposure to said activating potential.

Additionally, a multiplicity of opposed conductor electrode pairs may be affixed to the surfaces of the above described element to form an array of diodes.

By "activatable" is meant capable of forming a current path of low electrical resistance in response to an externally applied voltage pulse equal to or exceeding a critical threshold level.

In one embodiment a layer of composition (a) is contacted by an overlapping layer of p-type semiconductor component (b). In another embodiment the p-type semiconductor component (b) is particulate and intimately dispersed within a layer of metal particle-binder composition (a). In still another and preferred embodiment composition (a) is provided in two separated layers, each contacted by p-type semiconductor component (b) in layered form therebetween. On activation the outer two layers comprise first and second electrode compositions which serve as base electrode and counterelectrode for the diode formed.

Thus, the various embodiments of the invention include one, two, and three-layered electrical elements.

DETAILED DESCRIPTION OF THE INVENTION

Figure 1:
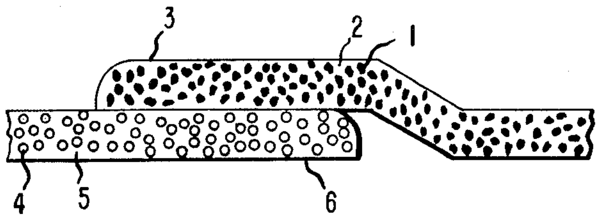
FIG. 1 is a side elevational view of a two-layered electrical element of this invention showing a layer of composition (a) contacted by an overlapping layer of p-type semiconductor component (b) illustrated as irregularly shaped p-type semiconductor particles dispersed in an insulating binder.

The activatable electrode composition (a) contains metal filler particles dispersed in an electrically insulating binder material selected for its stability. It is to be understood that the following discussion of binders applies equally well in all respects to the binders which may be associated with the second component of the element of this invention, namely, the semiconductor component which will be described hereinafter. Broadly, the polymeric binders can be chosen from many classes of organic polymers. The polymer should have a glass transition temperature ($T_g$) of at least 40°C., preferably at least 100°C., it must be unreactive with the filler particles and it must be capable of withstanding the thermal stresses which are applied during its manufacture and use. The binder materials used in this invention can include small amounts of solvent and other materials which may slightly reduce their glass transition temperatures, but to no lower than 40°C., by acting as plasticizers. Typical examples of polymeric binders that have $T_g$ values of at least 40°C. include organic polymers, typical examples of which can be selected from the well known polyolefins, polyvinyl derivatives, polybenzimidazoles, polyesters, polysiloxanes, polyurethanes, aromatic polyimides, poly(amideimides), poly(ester-imides), polysulfones, polyamides, polycarbonates, polyacrylonitriles, polymethacrylonitriles, polymethyl methacrylates, polystyrenes, poly(α-methylstyrenes) and cellulose triacetates. Representative members of these classes and their $T_g$ values are listed in Table I. Generally, the higher the $T_g$ the more thermally stable the polymer is as a binder in the composition. This generally may not be true if there is a degradative interaction between the polymer and the metal filler particles, for example, as is the case with cobalt particles and polyimides. Generally, too, the higher the $T_g$ the longer the life of the low resistance activated states. Extensive data on $T_g$ values are available in the art.

TABLE I

| Organic Polymers | $T_g$(°C.) |
|---|---|
| Aromatic polyimide (DAPE-PMDA) | 380 |
| Aromatic poly(amide-imide) (MAB/PPD-PMDA) | 265 |
| Aromatic polysulfone | 190 |
| Polyurethane | 150 |
| Polycarbonate | 150 |
| Polydecamethylene azelamide | 149 |
| Aromatic polyamide (70% IP/30% TP-MPD) | 130 |
| Polyacrylonitrile | 130 |
| Poly(α-methylstyrene) | 130 |
| Polymethacrylonitrile | 120 |
| Polymethyl methacrylate | 105 |
| Cellulose triacetate | 105 |
| Polystyrene | 100 |
| Polyvinyl formal | 81–108 |
| Polyacrylic acid | 80–105 |
| ABS polymer (Acrylonitrile/Butadiene/Styrene) | 95 |
| Polyvinyl alcohol | 85 |
| Polyindene | 85 |
| Polyvinylcarbazole | 84–85 |
| "Glyptal" alkyd resin | 83–87 |
| Hard Rubber | 80–85 |
| Polyvinyl chloride | 82 |
| Polyethylene terephthalate | 80 |
| Poly(vinyl chloride/vinyl acetate), 95:5 | 71 |
| Cellulose acetate | 69 |
| Polyethyl methacrylate | 65 |
| Poly(vinyl chloride/vinyl acetate), 88:12 | 63 |
| Nylon 66 | 57 |
| Poly(vinyl chloride/vinyl stearate), 90.3:9.7 | 56 |
| Poly-p-xylene | 55 |
| Poly(vinylidene chloride/vinyl chloride | 55–75 |
| Polypseudocumene | 55 |
| Polyvinyl pyrrolidone | 54 |
| Cellulose trinitrate | 53 |
| Cellulose acetate-butyrate | 50 |
| Polycaprolactam | 50 |
| Polyvinyl butyral | 49 |
| Polyhexamethylene sebacamide | 47 |
| Polychlorotrifluoroethylene | 45 |
| Ethyl cellulose | 43 |
| Poly(styrene/butadiene) 85:15 | 40 |

DAPE = diaminodiphenyl ether
PMDA = pyromellitic dianhydride

MAB = m-aminobenzoic acid
PPD = p-phenylenediamine
IP = isophthaloyl chloride
TP = terephthaloyl chloride
MPD = m-phenylenediamine In addition to the previously described organic polymers, certain thermosetting crosslinked organic polymers are operable herein as binders. Characteristics of thermosetting crosslinked polymers include low solubility in solvents, high melting points and a three dimensional aggregation of the individual polymeric chains. Examples of such polymers include thermosetting epoxy resins, unmodified or modified (preferably modified with a diamine).

Aromatic polyimides having a $T_g$ of at least 100°C., preferably at least 150°C., represent a preferred class of polymers which are useful herein as binders. Such polyimides and their preparation are well known in the prior art, for example, as shown by U.S. Pat. Nos. 3,179,630; 3,179,631; 3,179,632; 3,179,633; 3,179,634; and 3,287,311. Useful polyimides can be represented by the formula

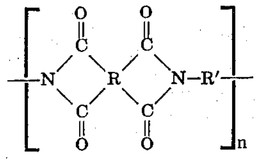

wherein $n$ is an integer sufficiently large to provide the desired polymer $T_g$, R is a tetravalent radical derived from an aromatic tetracarboxylic acid dianhydride, the aromatic moiety having at least one ring of six carbon atoms and characterized by benzenoid unsaturation, and R' is a divalent radical derived from a diamine. Aromatic tetracarboxylic acid dianhydrides which are useful for preparing operable polyimides include those wherein the four carbonyl groups of the dianhydride are each attached to separate carbon atoms in a benzene ring and wherein the carbon atoms of each pair of carbonyl groups are directly attached to adjacent carbon atoms in a benzene ring. Examples of dianhydrides suitable for forming polyimide binders include pyromellitic dianhydride; 2,3,6,7-naphthalenetetracarboxylic dianhydride; 3,3',4,4'-diphenyltetracarboxylic dianhydride; 1,2,5,6-naphthalenetetracarboxylic dianhydride; 2,2',3,3'-diphenyltetracarboxylic dianhydride; 2,2-bis(3,4-dicarboxyphenyl)propane dianhydride; bis-(3,4-dicarboxyphenyl)-sulfone dianhydride; and 3,4,3',4'-benzophenonetetracarboxylic dianhydride.

Organic diamines which are useful in the preparation of operable polyimides include those which are represented by the formula $H_2N—R'-NH_2$ wherein the divalent radical R' is selected from aromatic, aliphatic, cycloaliphatic, combinations of aromatic and aliphatic, heterocyclic, and bridged organic radicals, the latter wherein the bridge atom is carbon, oxygen nitrogen, sulfur, silicon or phosphorus. R' can be unsubstituted or substituted, as is known in the art. Preferred R' radicals include those which contain at least six carbon atoms and are characterized by benzenoid unsaturation, for example, p-phenylene, m-phenylene, biphenylylene, naphthylene and

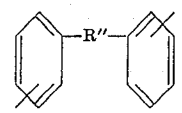

wherein R'' is selected from alkylene or alkylidene having one to three carbon atoms, O, S and $SO_2$.

The diamines described above also can be used in the formation of operable polyamide binders. Among the diamines preferred in the formation of polyamide and polyimide binders are m-phenylenediamine; p-phenylenediamine; 2,2-bis(4-aminophenyl)propane; 4,4'-diaminodiphenylmethane; benzidene; 4,4'-diaminodiphenyl sulfide; 4,4'-diaminodiphenyl sulfone; 3,3'-diaminodiphenyl sulfone; and 4,4'-diaminodiphenyl ether.

As disclosed in the prior art, some polyimides are not easily fabricatable because of their high melting points. With such polyimides, the metal particles which are required in the electrode composition of the present invention are introduced during the preparation of the polyimide. For example, they can be added to the polyamic acid, a fabricatable intermediate in the formation of the polyimide. As is well known, the polyamic acid can be dissolved in a suitable carrier solvent. Employing such techniques, the metal particles can be dispersed in a polyamic acid in a carrier solvent, the amounts of polyamic acid and metal particles being such that upon conversion of at least part of the polyamic acid to polyimide and removal of at least part of the carrier solvent, there will be produced the previously described polyimide-metal particle composition. Such polyamic acid-carrier solvent-metal particle compositions possess dielectric characteristics and can be shaped as desired prior to the conversion of polyamic acid to polyimide and removal of carrier solvent.

A particularly preferred polyimide binder having a $T_g$ of about 380°C. (by measurement of electrical dissipation factor) can be prepared from 4,4'-diaminodiphenyl ether and pyromellitic dianhydride by employing the precursor polyamic acid in N-methyl-2-pyrrolidone (available commercially as "PYRE-M.L." Wire Enamel RC-5057). The polyamide produced from such a polyamic acid and having aluminum particles dispersed in it can withstand a temperature of 450°C. for short periods of time and it can withstand continuous use at 220°C.

Aromatic polyamides having the requisite $T_g$ represent another class of preferred organic polymers for use as a binder in this invention. Such polymers are disclosed in U.S. Pat. Nos. 3,006,899; 3,094,511; 3,232,910; 3,240,760; and 3,354,127. One such polymer which is useful herein can be represented by the formula $\lbrack COC_6H_4CONHC_6H_4NH \rbrack_n$ wherein $n$ is an integer sufficiently large to provide the desired polymer $T_g$. Particularly preferred is a polymer of such formula wherein the $-COC_6H_4CO-$ units are isophthaloyl and/or terephthaloyl units and the $-NHC_6H_4NH-$ units are m-phenylenediamine units. One such particularly preferred aromatic polyamide binder can be obtained by reaction of essentially equimolecular quantities of m-phenylenediamine and phthaloyl chloride, the phthaloyl chloride being a mixture of about 70 mole percent isophthaloyl chloride and 30 mole percent terephthaloyl chloride. Such a polymer having a $T_g$ of 130°C. is thermally stable at 300°C. for significant time periods and it conveniently can be handled as a solution of the polyamide containing dispersed metal powder in the formation of layered compositions.

The metal filler particles which are used in the activatable electrode composition are non-conductive but are capable of becoming conductive upon exposure to an activating electrical potential; they preferably have smooth rounded edges along their surfaces. Before activation, electrical contact resistance blocks the passage of electrical current from one particle to another if they are touching within the polymeric binder. Generally, the particles have an electrically conductive interior and a dielectric surface that provides contact resistance when the particles touch so that conductive paths are not formed by the interconnection of particles in the binder. Upon electrical activation, the dielectric surface breaks down and is no longer effective in providing contact resistance between particles, thus allowing electrical contact between particles along a bridge type path. The electrically conductive interior of a filler particle can be a selected metal. The state of conductivity can be fully conductive ($10^{-6}$ to $10^{-3}$ ohm-cm.).

The dielectric surface that makes a metal filler particle nonconductive can be formed by coating the surface of the particulate material with an insulative chemical compound of the metal being coated, such as an oxide, sulfide or nitride of the metal. Readily obtained metals carrying an oxide coating that renders the aggregate of particles in the binder electrically insulative are aluminum, antimony, bismuth, cadmium, chromium, cobalt, indium, lead, magnesium, manganese, molybdenum, niobium, tantalum, titanium and tungsten. A preferred metal is aluminum with a tarnish film of insulative aluminum oxide which is readily formed by exposure of the aluminum to ambient atmospheric conditions.

The particulate metals which can be employed in this invention are preferably in the form of spheroidal or nodular shaped particles having smooth rounded edges. Such particle shapes are readily recognized by those skilled in the art as comprising two of the five art recognized particle groups for classifying pigmentary, including metal, particles with respect to shape, namely, spheroidal, cubical, nodular, acicular and lamellar. In order to select particles having shapes preferred for this invention, it is only necessary to distinguish between the characteristics of the spheroidal and nodular groups and the other three classification groups which have in common corners or sharp edges on the particles. The cubical shape is a common crystalline form having sharp edges. Acicular shapes are at least several times longer than their smallest diameter and resemble a needle or a rod. The lamellar shapes are extremely thin plates or flakes that sometimes overlap or leaf to form an almost continuous layer. Classification is routinely carried out by visual inspection under a microscope or by scanning electron microscope photographs. Other means based on greater tapping density, reduced viscosity in liquid suspension or greater mobility in electrical feeder-vibrator tests may sometimes be used to distinguish and even separate particles with smooth rounded edges from particles that have corners or sharp edges.

The inherent shape due to the natural crystalline form of a specific metal can be modified by certain known processes to produce spheroidal or nodular particles. Metal particles, in general, can be wet ground to produce particles having smoother or rounder edges than those produced by dry grinding. Powdered solids can be reduced in particle size and made round by means of a "Micronizer" mill comprising a circular chamber. The solids are injected into the mill using compressed air or high pressure steam so that the particles hit each other at very high speed. The fines are carried out through an opening in the center of the mill and are usually smoother and more uniform than those obtained by either wet or dry grinding. Such grinding processes are useful in producing spheroidal metal particles and, when applied to certain metals that are easy to fracture because of their crystalline form, for example, relatively brittle antimony or bismuth, they are useful in producing nodular or rounded irregularly shaped particles by a combination of fracturing and grinding.

If the melting point of the appropriate metal is sufficiently low, spheroidal or nodular particles can be prepared by atomization of the molten metal followed, usually, by screening to control the particle size. Atomized powders of aluminum tend to be nodular but, depending upon the atomization conditions and subsequent handling, they can be produced in a spheroidal shape. Powdered metals which are characterized by a smooth spherical configuration are commercially available. Such powders provide a high packing density and they simplify the dispersing of the metal in the polymeric binder.

Not all the particles of the metal filler need be smooth edged and mixtures of smooth edged and sharp edged particles can be used. As little as 30 percent, preferably at least 50 percent, by weight of smooth edged particles in the particulate filler is effective to substantially prevent cross-talk from occurring between the spaced apart conductive diode paths formed by activating the layered electrical element of this invention. More preferably, substantially all, that is, about 100 percent, of the particles should be smooth edged to avoid the possibility of cross-talk.

The average size of metal particles useful in this invention is in the range of about 0.01–1,000 microns. The thinner the thickness of the layered element desired, the finer should be the particle size. Particles having an average size of about 20 microns represent a preferred size. Particles which are black in color, that is, have a particle size that is smaller than the visible wavelength of light, are most preferred. The size of such particles is about 0.01–0.5 micron. Smaller particles limit the conductivity which can be obtained by subjection of the dielectric composition to an activating voltage and larger particles limit the mechanical strength of the composition and the degree of smoothness of the surface which can be obtained in a layered composition. For preferred compositions, particle shapes can range from commercially available cigar shaped (nodular) particles, with no sharp edges evident in a typical stereoscan electron microscope photograph, to essentially spherical particles with smooth rounded contours. Readily available nodular particles include those which pass a 100-mesh, 200-mesh or 325-mesh sieve (U.S. Sieve Series).

The metal filler particles are present in the electrode composition of this invention in an amount which is sufficient to achieve electrical activation which is marked by a sudden initial transition to a state of low resistance; the amount should not be so large that the physical strength of the binder is adversely affected. The minimum amount of metal particles required is about 15 percent by volume, but a dependable preferred range is 45–85 volume percent; this normally includes the amount required for square close packing of the particles in the binder, an arrangement in which the particles are each surrounded by four other particles of the same size as the nearest neighbors. Particularly preferred is an arrangement that provides closest particle-to-particle approach and, therefore, the state of lowest resistance upon electrical activation. For the preferred aluminum particles about 45–85 volume percent corresponds to about 67–95 weight percent. Such a composition thus comprises about 67–95 weight percent of aluminum particles and, the balance to achieve 100 weight percent, about 5–33 weight percent of polymeric binder. Small amounts of non-interfering, that is, non-essential, materials can be present. Amounts of aluminum below 67 percent, down to about 25 percent by weight, may be sufficient to achieve electrical activation but such amounts may present too much electrical resistance. Amounts above 95 percent may make the electrode composition crumbly and may make the surface of a layered composition uneven. Corresponding proportions by weight of other kinds of particles will vary with particle distribution, shape and density but they are readily determined by one skilled in the art.

The normally insulative, activatable electrode composition of this invention is a form-retaining solid by virtue of the stiffness of the binder material employed. The solid can be in any of several physical forms. For example, it can be a coating, film or sheet on any suitable support or it can be a self-suporting film or sheet of regular or irregular shape. The composition can be formed by employing known ways for homogeneously dispersing a filler component in a polymeric binder component. Known methods also can be employed to convert the composition to a layer of any desired thickness and shape. For example, a coating can be applied to a substrate by painting, spraying, dipping or other conventional technique involving evaporative drying. If the polymeric binder is readily meltable, a layered structure can be made by casting or extruding onto a substrate a polymer melt containing dispersed metal particles. Alternatively, a film of the composition can be cast on a support and stripped therefrom.

As already indicated above, when a high melting polyimide is employed as the binder, it may be more conveniently handled as it polyamic acid precursor dissolved in a suitable solvent. Such a polyamic acid solution can be employed in the aforesaid layer-forming procedure. The polyamic acid solvent should strongly associate with both the polyamic acid and the polyimide polymer that is subsequently produced and it should be removable by volatilization. Suitable solvents include N,N-dimethylformamide, N,N-dimethylacetamide, dimethyl sulfoxide, N-methyl-2-pyrrolidone and tetramethyl urea. After being converted to a layered structure, the polyamic acid can be readily converted to a polyimide in situ by heating to effect ring closure with elimination of water; at the same time the carrier solvent is volatilized off.

As stated above, the electrode composition generally is disposed as a layer; the shape and dimensions thereof are not critical since its intended function when it is transformed into an electrically conductive element depends not on its bulk but on its ability to form wire like internal paths of low resistance between closely spaced pairs of opposed electrode contacts on opposite sides of the layered composition. Layer thickness will vary with the particular use and usually will be in the range of about 0.1–10,000 microns, more usually 100–2,000 microns.

The electrode composition disposed as a layer has an electrical resistance of at least $10^8$ ohms and is typically over $10^{10}$ ohms between area electrodes. Such a composition can be made conductive by passage of an electrical current of sufficient strength to create a conductive path through the dispersed filler particles. Conductivity testing and activation capability can be carried out using two test electrodes. By application of an activating voltage pulse through a protective series resistor, specific resistance values can be attained, in the range of about 1–250,000 ohms. The activating voltage should be sufficient to exceed the threshold value needed to burn through the particle insulating coating and create conductive links between particles along the path between the opposed electrodes. Normally, a pulse of 150–400 volts is effective for this purpose. Once a conductive path has been established, its resistance should remain essentially unchanged, particularly for the preferred polymeric binders having a high $T_g$. Conductance in the created paths follows Ohm's law, the current flow being proportional to the electromotive force applied. The electrical resistance of the path formed depends on the magnitude of the applied voltage pulse and on the thickness of the layered composition as well as on the kind, particle size and mount of filler particles. In general, resistance is decreased by increasing the activating voltage above the critical threshold level for activation, by using larger particles and by using metal particles with higher inherent conductivity. It can also be decreased by reducing the size of the protective series resistor, nominally maintained at 150,000 ohms, which is used to limit the current which flows when the activating voltage pulse is applied. Thus, an activated electrode composition with any desired electrical properties within those practical with the materials used can be obtained from a wide variety of combinations of applied potential and current and size, type and amount of filler particle.

The wire like electrically conductive paths which are produced as described above normally have lateral widths not much wider than the diameter of the filler particles that bridge or join in a chain like conductive path upon suitable electrical treatment. Path length, that is, the thickness of a layer, can be 0.1–10,000 microns as described above. In general, the shorter the path, the lower the path resistance. The width of a conductive path, however, is particle size dependent, so that one path can be very close to other paths, yet still be separated or isolated by unactivated and still insulative filler-binder composition.

In the layered electrical element the activatable electrode composition is in contact with a semiconductor component. As already mentioned, various embodiments inclue one, two, and three-layered electrical elements. Regardless of the number of layers, the semiconductor material present in at least one layer generally exhibits relatively high lateral electrical resistance compared to the resistance of transverse diode paths to be formed between opposing surfaces of the layered element. Said semiconductor material can be particulate or solid, the latter provided its electrical conductivity is sufficiently anisotropic so as to provide high lateral electrical resistance. The nature of the semiconductor material and its conductivity is, therefore, important in limiting undesirable electrical connections laterally between diodes in an array.

P-type semiconductors useful as one component in the element of this invention normally have resistivities that are between metals and insulators, that is, in the range $10^{-3}$ to $10^{+9}$ ohm-cm. They are more specifically characterized by a combination of their negative temperature coefficient of resistance and their positive Hall coefficient (deflection of current carriers in a transverse direction by a magnetic field as if positively charged electrons are flowing). Such positively charged electrons (positive Hall coefficient) are believed to arise because of mobile hole defects in the electron distribution. The mobilities of holes and of electrons in various crystalline semiconductor materials have been compiled in the literature. Therefore, those knowledgeable in the semiconductor art can select a suitable starting base material and add by diffusion or epitaxial growth a source of hole conductors (called a dopant) to form a p-type semiconductor which is useful in this invention. For example, silicon and germanium crystal lattices are simply treated as shown in the art by adding a source of hole conductors to promote p-type semiconductivity. Preferred is the selenium crystal lattice which requires no treatment at all to be p-type, which is also relatively insensitive to impurities which tend to reduce hole mobility or concentration, and which conveniently melts at a low temperature of about 220°C. to form a rectifying junction with metals. It also tends to be suitably anisotropic in electrical conductivity in layered form to provide high lateral resistance. When it is annealed, its color becomes that of the highly electrically conductive gray β-form. Lattice defects at the ends of its crystalline chains are believed to be the principal source of current carriers, that is, holes, but halogens such as iodine have the effect of increasing its p-type conductivity.

Figure 2:
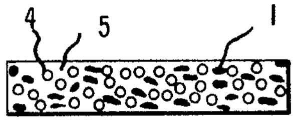
FIG. 2 is a side elevational view of a single-layered electrical element of this invention in which the p-type semiconductor component is particulate and intimately dispersed within a layer of metal particle-binder composition (a).
Figure 3:
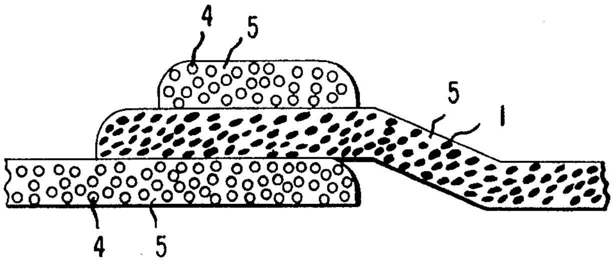
FIG. 3 is a side elevational view of a three-layered electrical element of this invention in which composition (a) is provided in two separate layers, each of which is in contact with a layer of p-type semiconductor component (b).

In contacting the activatable electrode composition with the p-type semiconductor, the latter can be formed in situ by separately introducing two reactants, a crystalline base material in particulate form, such as selenium particles, and a dopant, such as iodine in solution, or it can be added directly as p-type semiconductor material, for example, suitably pure silicon particles already doped with a Group III element (of the Periodic Chart of the Elements). Such a contact is essentially a physical touching of the activatable electrode composition layer and the semiconductor component in the sense that a test object of a given thickness cannot be interposed between the two. Such contact can be attained in at least two ways. A first way (as shown in FIG. 1) is by overlapping a dispersion of the p-type semiconductor particles 1 in an insulating binder 2 (previously discussed in connection with the description of the activatable electrode composition) as a second layer 3 on top of the activatable electrode composition (insulated metal particles 4 in an insulating binder 5) disosed as a first layer 6. This kind of layer-to-layer contact is common to a two-layer (FIG. 1) and a three-layer (FIG. 3) electrical element embodiment in which the middle layer comprises the p-type semiconductor component. A second way of attaining contact between the activatable electrode composition and the p-type semiconductor, illustrated in FIG. 2 as a one-layer embodiment, is by using excess binder material 5 in the electrode composition so tha the quantity of dispersed metal particles 4 is less than the minimum amount required to achieve electrical activation, for example, less than 25 percent by weight of aluminum particles, but then compensating by having a sufficient quantity of semiconductor particles 1 co-dispersed directly in the same layer with the metal particles so that the total quantity of combined particles is sufficient for electrical activation, for example, at least 25 percent but less than 85 percent of the total weight of aluminum particles, semiconductor particles and the binder.

Instead of p-type semiconductor particles in a separate overlapping film or incorporated into the electrode composition, other suitable particles can be used which are prepared by pulverizing undoped semiconductor material of at least 99.9 percent to pass through a 325-mesh sieve (U.S. Sieve Series), provided such particles are subsequently doped in situ, for example, by treatment of the layered electrical element with an iodine solution. Normally, wetting the surface of the layer containing the undoped particles with the iodine dopant solution is sufficient if the carrier solvent which is used can penetrate the binder surrounding the particles. As another way to dope in situ, aluminum already present as dispersed metal particles in the electrode composition can sometimes induce p-type conductivity in co-dispersed silicon and germanium particles when heated by the passage of the electrical current that produces the wire like conductive path described above.

The overlapping film containing dispersed p-type semiconductor particles is preferred and, except for the simple substitution of the semiconductor particles for the metal particles, has the same composition as the first composition; it can be prepared in the same way and it seems to be activated in the same way.

The preferred semiconductor, selenium, requires some special handling in forming a three-layered electrical element. After removing carrier solvent by evaporation to leave a dispersion of selenium particles in the binder, the overlapping film is pressed, preferably without heat or oxidation of the selenium to its oxide, to pressures as high as 15,000 psig. to make firm contact with the underlying electrode layer comprising preferred aluminum particles in the same binder as that used with the selenium particles. The electrode layer itself is pressed at pressures up to 30,000 psig. before the selenium layer is applied to its surface.

It is extremely beneficial to subsequent diode performance to anneal the exposed surface of the overlapping film for about 0.5 to 2 minutes in air to form a thin, insulative selenium oxide layer on the surface. For convenience, other means of effecting surface oxidation of selenium particles to form a desirable insulative coating of selenium oxide can be employed, such as by contacting the selenium/binder film with a chemical oxidizing agent, for example, a hydrogen peroxide solution. Wetting of the surface with a dopant solution of iodine is also beneficial before the second activatable electrode composition is applied. Other ways for introducing impedance to electron flow in the direction from the semiconductor to the second activatable counterelectrode are known in selenium barrier layer art.

The activatable electrode composition which is next to be applied as a third and topmost layer can have the same composition as the first and bottommost electrode layer composition; it can also be prepared and contacted, layer-to-layer, with the p-type selenium semiconductor middle layer in the same way. However, slightly better diode performance is normally attained by dispersing a different metal in the third layer composition than is dispersed in the first, preferably one that stands lower than aluminum in the electromotive series of the elements, such as cadmium, again using the same binder as in the first two layers.

To make a three-layered embodiment of an electrical element ready for forming an array of diodes, conductor electrodes are then affixed oppositely on the outer surfaces of the activatable electrode layers of the element. The only requirement is that such conductor electrodes be conductive relative to the wire like conductive path to be created between them, that is, the electrode must exhibit volume resistivities usually no greater than that of carbon.

The combined thickness of two dispersed metal particle layers and the layer of dispersed p-type semiconductor particles between them can be up to about 50 mils in thickness. Either one of the activatable electrodes can be about 10 to 20 mils thick. Despite such a difference in thickness the same order of electrical potential difference is normally required to form an electrically conductive path through the entire structure as is required to form a path through just one of the activatable electrode layers. This may be a consequence of the high voltage concentrating at the ends of a chain of metal particles already formed; other equally consistent mechanisms may be advanced. Between two conductor electrodes standing oppositely across the diode-forming structure, a difference in electric potential or voltage of 150 to 400 volts is normally required to form an asymmetrical conductive path, whereas in capability testing, the same 150 to 400 volts is normally required to form a symmetrical conductive path through just one of the dispersed metal-binder electrode layers.

The asymmetry of the conductive path through the structure is characterized by a relatively low resistance to current flow in a direction that can be related to that conductor electrode which is raised to a positive potential during conductive path information. The direct current source of potential difference is normally a charged capacitor that has polarity; a typical capacitor value is 0.002 mfd. In making connections to the conductor electrodes a 300,000 ohm resistor is normally placed in series with the positive terminal of the capacitor and the other side is connected to ground potential. Alternatively, a variable voltage supply can be used to create a voltage surge.

The degree of asymmetry of the conductive path obtained in a three-layer embodiment appears to be greatest by grounding the first made electrode layer and raising the conductor electrode on the annealed selenium surface counterelectrode side to a positive potential, that is, connecting it to the positive terminal of the capacitor, with the series resistor therebetween. The current momentarily increases to a maximum of about 0.5 to 50 milliamperes and decays in about 10 microseconds. By subsequent measurements of resistances with a Simpson Volt Ohmyst meter (the black lead of such a meter normally carries a positive test voltage) the easy direction of current flow through the structure is determined to be from the first electrode layer to the second electrode layer. The result is consistent with the typical selenium rectifier in which electrons flow easily from the counterelectrode where they are abundant to the selenium layer where they are not. Alternatively, the degree of asymmetry of the conductive path obtained can be enhanced by conducting a multi-step process consisting of multiple activations to create a current path of low resistance. The number of steps and the voltage polarity at each step can be varied to achieve higher asymmetry but, for the final treatment, the counterelectrode is preferably made positive in potential in order to increase the resistance in the reverse direction of the resultant diode while keeping the forward resistance low.

Where the element of this invention is single-layered, that is, metal particles and p-type semiconductor particles are dispersed in a common binder, a diode can be formed in the same way as in the multi-layered element, by applying the same kind of conductor electrodes and the same magnitude of voltage pulse or voltage surge for the same length of time and creating the same kind of asymmetrically conductive path. The forward direction of the resultant diode path is related to the polarity of the applied voltage as in Example 2 which follows.

In preparation for forming an array of conductive paths, multiple pairs of conductor electrodes are usually affixed permanently to the electrically activatable structure and then suitable activating electrical potentials are applied to one pair at a time, to groups at a time or to all pairs of electrodes at once. Spacing can be as close as a fraction of a mil, for example, 0.01 mil, and usually it will not be greater than about 50 mils for high density packing of conductive diode paths. The order and timing in which such conductive paths are formed between the points of contact of the pairs of conductor electrodes are not critical, but sometimes, in forming dense arrays of closely spaced diodic paths, heat buildup during activation can impair the stability of the element if all or even a group of paths are formed at one time. Whether the electrically activatable element consists of one or many layers, pairs of electrodes are usually affixed oppositely to its top and bottom surfaces. Electrical activation then forms substantially parallel, multiple diode paths that are perpendicular to the surfaces of the layers from a first surface to a second surface, both surfaces remaining laterally nonconductive. In general, the thinner the element, the closer the substantially parallel paths can be. Electrode shape, cross-sectional area, size and form make little difference in the electrical activation step; for example, silver, copper and gold paints, copper wire (for example, No. 30 and No. 18, AWG wire size), straight pins, pressure sensitive adhesive-backed metal foils, rounded, spring loaded pressure contacts and alligator clips are useful. The cross-sectional area must be sufficiently small to permit the formation of a desired density of conductive paths so that neighboring pairs of electrodes do not touch each other. For example, No. 30 copper wire is small enough in diameter to use in forming mutually isolated conductive paths about 50 mils apart. Needle like electrodes or photographically produced electrodes are suitable to use in forming paths less than 1 mil apart.

The element of this invention is useful in preparing a read-only memory comprising a thin layered structure having a multiplicity of closely spaced, yet isolated, diode paths formed by electrical activation, wherein each such path can serve as an electrically conductive connecting channel of the read-only memory. The read-only memory offers means of selectively channeling information into or out of a computer.

Figure 4:
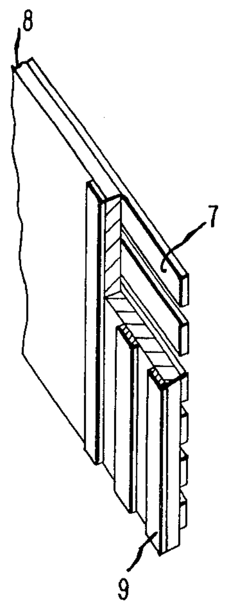
FIG. 4 is a partially cut away pictorial presentation of a matrix array.

To prepare a read-only memory according to this invention, a plurality of opposed conductor electrodes are applied to the activatable electrode composition layers by means described above. FIG. 4 depicts such electrodes in combination with a single layered electrical element of this invention. To address any one of X times Y activatable zones using only X plus Y conductive leads, it is convenient to transversely affix X-axis conductor electrodes 7 that are closely spaced and parallel on one activatable electrode surface of the element 8 and uprightly affix spaced parallel Y-axis electrodes 9 on the other activatable electrode surface of the element 8. A positive electric potential of about 150 to 400 volts, sufficient in size to establish voltages at least equal to the respective threshold voltages of about 150 volts across each layer, is applied between some parallel conductor electrode affixed to the second component, for example, $Y_n$, and a selected $X_m$ electrode affixed oppositely. Different pairs of electrodes are used thereafter, applying a voltage in the same direction and within the same range. For example, N-diodic memory elements can be addressed by using $2\sqrt{N}$ conductor electrodes, for example, $2\sqrt{100}$ or 20 conductor electrodes, 10 on each opposite side of the structure, to address 100 elements. At any time a test lead held at a negative potential of a resistance-measuring device is attached to Y electrodes in turn, touching the other lead to the X electrodes to determine where conductive paths exist. Said positions of conductive paths are related back to the pattern of activating voltages in X and Y.

The techniques just described make the element described above conductive between two points without affecting the electrical properties in other areas. Electrode compositions can be made conductive between essentially all points on their surfaces by exposure of the surface to many activating voltage pulses. The ability to create closely spaced conductive paths within 10–50 mils of each other finds application in the computer or electronic fields.

The structures of this invention are useful in forming a wire like diode path between chosen opposing surface locations and can form a multiplicity of such paths which are electrically separated from each other. As a result, elements of this invention can serve as read-only memory devices for a computer when placed between a plurality of opposed conductor electrodes. A densely packed array of diodes can be formed electrically according to a desired pattern and the rigid structure can be handled and interchanged freely at the input or output interfaces of a computer.

In the following examples, unless otherwise indicated, all quantities are by weight.

Example 1

A mixture was made of (a) one part of a solid polyamide having a $T_g$ of 130°C. and prepared from equimolecular portions of m-phenylenediamine and a mixture of 70 parts of isophthaloyl chloride and 30 parts of terephthaloyl chloride, as described in U.S. Pat. No. 3,354,127, (b) 1.5 parts by weight of commercially available aluminum powder (minimum 98 percent through U.S. Sieve No. 100, maximum 85 percent retained on U.S. Sieve No. 325), and (c) 5.7 parts of dimethylacetamide as a solvent for the polymeric binder. This mixture was spread on an inert surface and heated until the solvent evaporated; the resulting layer was about 25 mils thick. From the film a 0.25 inch disc-shaped test plug was cut and pre-pressed at 30,000 psi. A surface of this disc was painted with one part of a commercially available, 325-mesh red selenium powder dispersed in components (a) and (c) above and dried by solvent evaporation. The dry painted disc was annealed at 190°C. for 5 hours to convert the red powder to a gray color; it was then pressed while hot into a uniform layer approximately 0.1 mm. in thickness.

To form a counterelectrode, a paste formed by mixing 1 part of the polymer used in (a) above with 1 part of a commercially available, cadmium metal powder (325-mesh) and 5.7 parts of N,N-dimethylacetamide was applied to the gray selenium layer to form a thin coating 5 mils thick after heating to evaporate the solvent.

Two pairs of opposed wire electrodes, about 50 mils apart, were pressed against the bottom of the test plug and oppositely against the counter electrode. Resistance exceeding $10^{12}$ ohms was measured between opposed, adjacent and opposed-adjacent electrodes. Measurements were made using a Keithley Model 200B D.C. Electrometer with a Model 2000 current shunt.

An activating potential of 250 volts was applied to a first electrode pair, making the cadmium counterelectrode positive in potential. A current of 40 milliamperes was observed to flow. The measured resistance developed in the easy direction from the disc to the counterelectrode was 3.9 megohms; in the opposite direction it was 11 megohms.

The procedure was repeated using the second pair of electrodes developing resistances of 5 megohms and 11 megohms. The resistance between the two pairs of electrodes continued to exceed $10^{12}$ ohms.

Example 2

A series of mixtures was made of (a) one part by weight of a commercially available polystyrene, (b) aluminum powder as used in Example 1 in parts by weight as given in Table II, and (c) toluene as solvent in the amount of 5 cc. per gram of polystyrene. To each mixture were added 0.2 part by weight of a commercially available silicon powder (99.9 percent pure, 150–325 mesh) and the number of drops as given in Table II of 1 percent iodine solution in toluene per 20 cc. of prepared mixture. Sufficient quantities of each mixture, to which silicon powder and iodine solution had been added, were deposited on a 1 × 3 inch glass microscope slide to form a 1–2 mil thick film upon air drying at 40°–50°C. for 24 hours. Two electrodes spaced about one-eighth inch apart and extending across the width of each slide were painted and dried on each film using a conductive silver preparation containing silver powder. Mixtures containing 0.1 part or more of aluminum were made conductive by an electric potential of 250 volts and the mixture containing 0.05 part of aluminum was made conductive by 300 volts, applied through a series resistor of 330,000 ohms. The electrical resistances were measured by use of a Simpson Volt Ohmyst meter and found to be consistently lower when a negative test voltage was applied to the silver electrode to which a positive electric potential had been applied to form a continuous asymmetrically conductive path between opposed electrodes. The ratios of forward-to-back resistance ranged from 1.1 to about 11 and were sufficient to be useful in charging a battery and in electroplating with an alternating voltage source.

TABLE II

ELECTRICAL PERFORMANCE OF ACTIVATED ALUMINUM/SILICON DISPERSIONS

| Parts Aluminum | Drops $I_2$Sol'n. per 20 cc. of Prepared Mixture | Thousands of Ohms Resistance Forward | Back | Ratio |
|---|---|---|---|---|
| .05 | 3.3 | 70 | 800 | 11.4 |
| .10 | 5 | 9.9 | 10.5 | 1.1 |
| .12 | 5 | 1.000 | 5.000 | 5.0 |
| .14 | 6 | 330 | 360 | 1.1 |
| .16 | 6 | 1100 | 5000 | 4.5 |
| .18 | 6 | 1500 | 3500 | 2.3 |
| .20 | 7 | 130 | 180 | 1.4 |
| .22 | 7 | 440 | 600 | 1.4 |
| .24 | 8 | 360 | 540 | 1.5 |
| .26 | 9 | 7.5 | 8 | 1.1 |
| .28 | 10 | 800 | 950 | 1.2 |

Example 3

A disc-shaped test plug containing aluminum powder dispersed in polymer was prepared as in Example 1, but the selenium powder of that example was first doped with iodine by the following procedure to increase its p-type conductivity before being dispersed in polymer solution and applied to the test plug. 0.1 gram of reagent grade Iodine was heated to 220°C. with 5 grams of a commercially available red selenium powder in a flask under dry nitrogen and agitated until mixed with the melted selenium. After cooling, the shiny metallic mixture with a soft consistency was spread as a thin layer, exposed to air and then was heated to 210°C. to remove excess iodine. The selenium layer became brittle upon cooling; it was ground to pass a 325-mesh sieve. The electrical conductivity of the selenium was improved by several orders of magnitude by the doping procedure. The resultant selenium powder was then dispersed with polymer and carrier solvent as in Example 1 and painted on the test plug. When dry, the painted test plug was pressed to 15,000 psi. gauge pressure, heat-treated at 202°C. for two minutes and again pressed to the same pressure at 188°C. to form a uniform layer of gray selenium particles bound in a polymeric binder approximately 4.0 mils thick on the test plug. The selenium particles at the surface of the layer were then oxidized by contact with 30 percent aqueous hydrogen peroxide solution for two minutes.

To form a counterelectrode, a mixture was prepared having the same composition as that used to prepare the first-mentioned disc-shaped test plug, that is, aluminum powder in polymer solution; it was applied to the surface of the seleniumbinder layer to form a thin coating about 5 mils thick after heating to evaporate the solvent.

Two pairs of opposed conductor electrodes, about 50 mils apart, were affixed to the layered element and a resistance exceeding $10^{12}$ ohms was measured between opposed, adjacent, and opposed-adjacent electrodes using the electrometer with the current shunt. An activating potential of 250 volts from a direct current voltage source was applied to a first electrode pair, making the last applied counterelectrode layer positive in potential. A current of 5 milliamperes was observed to flow; it persisted upon continued application of the voltage for 15 seconds. The voltage was reversed, making the counterelectrode negative in potential, and a similar current of about 5 milliamperes was observed to flow for a similar length of time. After a second voltage reversal, again making the counterelectrode positive in potential and again resulting in similar current flow, small test voltages were employed to determine diode performance. The measured resistance developed in the easy direction for current flow from the disc to the counterelectrode was 30,000 ohms; in the opposite direction it was 325,000 ohms.

The procedure was repeated using the second pair of electrodes developing resistances of 25,000 ohms and 350,000 ohms. The resistance between the two pairs of electrodes continued to exceed $10^{12}$ ohms.

We claim:

1. A layered electrical element which comprises:

a. an activatable electrode composition consisting essentially of an insulating binder having insulatively coated metal particles dispersed therein, with the particles and binder together constituting an insulator in the unactivated state but being capable of becoming electrically conductive on exposure to an activating potential, and b. a semiconductor component disposed in an insulating binder in contact with (a), said layered element presenting a first surface and a second opposing surface and a volume therebetween which are normally non-conductive, said element being normally insulative but capable of exhibiting rectifying properties with respect to current flow between said surfaces upon electrical activation, said surfaces being capable of remaining laterally non-conductive and said volume being capable of becoming conductive between said surfaces on exposure to said activating potential.

2. An element according to claim 1 wherein said first surface is in contact with at least one conductor electrode and said opposing surface is in contact with at least one opposing conductor electrode.

3. An element according to claim 1 wherein the layered element consists essentially of two layers of said activatable composition (a) and positioned therebetween a layer of said semiconductor component (b), said semiconductor layer being laterally non-conductive.

4. An element according to claim 3 wherein the semiconductor layer consists essentially of an insulating polymeric binder material having semiconductor particles dispersed therein.

5. An element according to claim 1 wherein the layered element is a single layer having metal particles and semiconductor particles co-dispersed in a common insulating binder.

6. An element according to claim 1 wherein the metal particles of (a) are selected from the group consisting of aluminum, antimony, bismuth, cadmium, chromium, cobalt, indium, lead, magnesium, manganese, molybdenum, niobium, tantalum, titanium and tungsten.

7. An element according to claim 1 wherein the metal particles of (a) are aluminum powder particles.

8. An element according to claim 3 wherein both layers of activatable composition comprise aluminum powder particles having an average particle size of 0.01 to 1,000 microns dispersed in an insulating binder.

9. An element according to claim 7 wherein the aluminum metal particles of (a) are essentially spheroidal or nodular shaped particles having smooth rounded edges.

10. An element according to claim 4 wherein the semiconductor particles are gray, highly conductive $\beta$-selenium particles.

11. An element according to claim 3 wherein the metal particles dispersed in one of the layers of the activatable composition are cadmium particles.

12. An element according to claim 4 wherein the binder materials of both (a) and (b) have a glass transition temperature of at least 100°C.

13. An element according to claim 11 wherein the binder material of both (a) and (b) is an aromatic polyamide prepared from m-phenylenediamine and a 70/30 mixture of isophthaloyl chloride and terephthaloyl chloride.

14. An element according to claim 1 wherein said first surface is in contact with two or more spaced apart conductor electrodes and said second surface is in contact with two or more spaced apart opposing electrodes.

15. An element according to claim 1 wherein said semiconductor component (b) is a p-type semiconductor.

* * * * *